United States Patent
Norton (10) Patent No.: US 10,966,340 B2
(45) Date of Patent: Mar. 30, 2021

(54) TRAY WITH MEMORY MODULES

(71) Applicant: HEWLETT PACKARD ENTERPRISE DEVELOPMENT LP, Houston, TX (US)

(72) Inventor: John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 148 days.

(21) Appl. No.: 16/129,760

(22) Filed: Sep. 12, 2018

(65) Prior Publication Data
US 2020/0084907 A1    Mar. 12, 2020

(51) Int. Cl.
| H05K 7/14 | (2006.01) |
| G06F 13/16 | (2006.01) |
| G06F 1/18 | (2006.01) |
| G06F 13/40 | (2006.01) |

(52) U.S. Cl.
CPC ........... H05K 7/1489 (2013.01); G06F 1/182 (2013.01); G06F 1/183 (2013.01); G06F 13/1668 (2013.01); G06F 13/4081 (2013.01)

(58) Field of Classification Search
None
See application file for complete search history.

(56) References Cited

U.S. PATENT DOCUMENTS

| 5,315,478 | A | 5/1994 | Cadwell et al. | |
| 6,392,884 | B1 * | 5/2002 | Chou | G06F 1/184 |
| | | | | 360/98.01 |
| 6,459,571 | B1 * | 10/2002 | Carteau | G06F 1/184 |
| | | | | 312/35 |
| 8,120,922 | B2 * | 2/2012 | Randall | G11B 33/126 |
| | | | | 361/725 |
| 8,191,841 | B2 * | 6/2012 | Jeffery | G11B 33/02 |
| | | | | 165/104.13 |
| 8,817,470 | B2 | 8/2014 | Aoki et al. | |
| 9,095,070 | B2 * | 7/2015 | Ross | G11B 33/128 |
| 9,456,519 | B2 * | 9/2016 | Bailey | H05K 7/1488 |
| 9,468,126 | B2 * | 10/2016 | Pronozuk | H05K 7/1488 |
| 9,823,856 | B1 * | 11/2017 | Tripathi | G06F 3/0611 |
| 9,839,140 | B2 | 12/2017 | Cox et al. | |
| 10,064,305 | B1 * | 8/2018 | Zhai | H05K 7/1427 |
| 2002/0181197 | A1 * | 12/2002 | Huang | G11B 33/128 |
| | | | | 361/679.39 |
| 2007/0230110 | A1 * | 10/2007 | Starr | G11B 33/10 |
| | | | | 361/679.31 |

(Continued)

OTHER PUBLICATIONS

Rack Server; "GS-R22PD2 (rev. 1.0)"; printed on Mar. 13, 2018 from: http://b2b.gigabyte.com/Rack-Server/GS-R22PD2-rev-10#ov; 6 pages.

(Continued)

Primary Examiner — Xanthia C Cunningham
(74) Attorney, Agent, or Firm — Hewlett Packard Enterprise Patent Department (57) ABSTRACT

A module, comprising: a door disposed on a front face of the module; a tray is accessible through the door, the tray including a slot to accept a memory module, wherein the memory module includes a plurality of slots for memory devices and wherein the tray is extendable from a recessed position within the module to a position extended from the module, to allow insertion of the memory module in the tray; and an interface to connect the memory module to a host.

20 Claims, 6 Drawing Sheets

(56) References Cited

U.S. PATENT DOCUMENTS

| | | | | |
|---|---|---|---|---|
| 2009/0152216 A1* | 6/2009 | Champion | G06F 1/183 | 211/26 |
| 2010/0110628 A1* | 5/2010 | Barrenechea | G06F 1/183 | 361/679.48 |
| 2011/0249392 A1* | 10/2011 | Kadri | G06F 1/187 | 361/679.37 |
| 2013/0050963 A1* | 2/2013 | Zhou | H02G 11/006 | 361/752 |
| 2013/0265714 A1* | 10/2013 | Tsao | G06F 1/181 | 361/679.53 |
| 2014/0108692 A1* | 4/2014 | Doglio | G06F 1/183 | 710/300 |
| 2014/0126144 A1* | 5/2014 | Kyle | G06F 1/16 | 361/679.58 |
| 2014/0189196 A1* | 7/2014 | Kelkar | G06F 12/16 | 711/102 |
| 2014/0248028 A1* | 9/2014 | Campbell | G02B 6/4452 | 385/135 |
| 2016/0081219 A1* | 3/2016 | Jau | G06F 1/183 | 361/679.02 |
| 2016/0150667 A1* | 5/2016 | Xu | H05K 7/1489 | 361/679.4 |
| 2016/0321171 A1* | 11/2016 | Kanno | G06F 12/0246 | |
| 2017/0135242 A1* | 5/2017 | Kurosaki | H05K 7/1487 | |
| 2017/0286352 A1 | 10/2017 | Kumar et al. | | |
| 2017/0311474 A1* | 10/2017 | Raisoni | H05K 7/1489 | |
| 2018/0239537 A1* | 8/2018 | d'Abreu | G06F 3/067 | |

OTHER PUBLICATIONS

Remsburg, R.; "CFD Helps Air Bullets Take Aim at Electronics Cooling"; Apr. 7, 2011; 12 pages.

\* cited by examiner

TRAY WITH MEMORY MODULES

BACKGROUND

Computing devices may utilize pools of memory. A memory pool may include a large amount of physical memory. In some cases, the memory pool may be accessed through multiple switch hops (as in, the memory may be connected to the computing device through multiple switches) from the computing device that may use the memory pool, thus introducing latency. In another case, creating a memory pool in different types of computing devices may not be possible due to thermal constraints. Additionally, the computing device may have limited physical space.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices may utilize pools of memory. A memory pool may include a large amount of physical memory. In some cases, the memory pool may be accessed through multiple switch hops (as in, the memory may be connected to the computing device through multiple switches) from the computing device that may use the memory pool, thus introducing latency. In another case, creating a memory pool in different types of computing devices may not be possible due to thermal constraints. Additionally, the computing device may have limited physical space. For example, a blade server in a blade enclosure may have less space than a typical rack server. The physical size of the blade server restricts the amount of memory that could be added to the blade server. Additionally, for memory centric computing large amounts of memory may be utilized. A typical rack server may not include the space for the maximum amount of memory needed in a memory centric computing environment.

Examples described herein include a system or module. The module may be a switch that racks into a blade enclosure. The module may be another computing device, for example a 1 rack unit (U) rack module or half U rack module. The module may include other components, such as network ports, interconnect ports, management ports, and/or various other components. The module may include a tray. The tray may extend from the module and retract into the module. The tray may be accessible through a door disposed on the front face of the module. The door may, when the tray is in a retracted or recessed position (as in, within the module), create a seal. The seal may prevent electromagnetic interference (EMI) leakage and/or air leakage. In other words, the seal created by the door may maintain the air pressure within the module. The tray may include a slot or interface at the back of the tray to accept a memory module. In other words, when the tray is in an extended position and the door is open, a user may add a memory module to the tray. The memory module may include a plurality of memory devices. The memory module or memory modules may form a memory pool. The slot or interface of the tray may connect to an interface located at the back of the module. The interface at the back of the module may connect the plurality of memory devices, via the memory modules inserted into the tray, to other computing devices. The module may support multiple topologies based in part on the number of memory modules within the module, the amount of computing devices connected to the module, the way the modules are connected to the interfaces located at the back of the module. The examples described above may allow computing devices to access the memory module or plurality of memory modules with low to no switch hops. In other words, the connection between the memory module and a computing device may be separated by, for example, one or zero switches (for example, an application specific integrated circuit (ASIC) which may perform switching functionality).

Accordingly, various examples include a module comprising a door disposed on a front face of the module. A tray may be accessible through the door and the tray may include a slot or interface to a memory module. The memory module may include a plurality of slots for memory devices. The tray may be extendable from a retracted or recessed position within the module to a position fully or partially extended from the module. In the position where the tray is fully or partially extended from the module, the tray may allow insertion of the memory module in the tray. The module may also include an interface to connect the memory module to a host.

As used herein, a "host" may include a subsystem or a component of an overall system. A host may be a node, cartridge, blade server, controller, storage controller, an application specific integrated circuit (ASIC), a system on a chip (SOC), a microcontroller, or combination of components. A host may, physically or virtually, include a processing resource and memory. A host may include an operating system or environment. A host may connect to multiple devices, for example, PCIe devices and/or storage devices. A system or computing device may include one or more hosts. In an example, a host may communicate with other hosts. Hosts may determine which host may initialize devices, write to devices, power on or off devices, and/or perform various other tasks.

Figure 1:
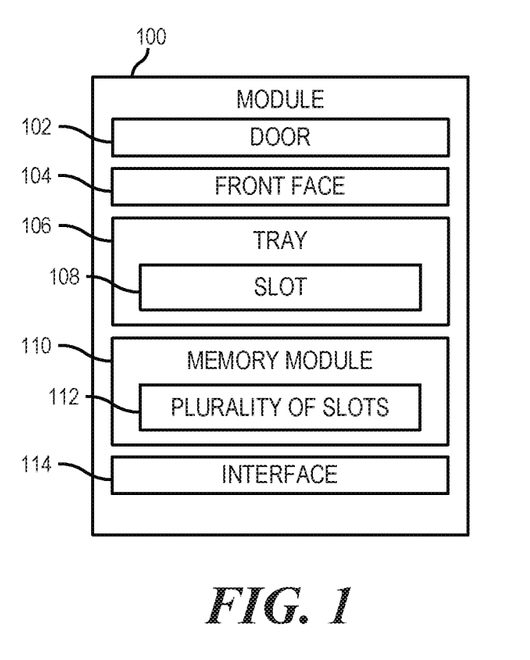
FIG. 1 is a block diagram of a module including a memory module, according to an example.

FIG. 1 is a block diagram of a module 100 including a memory module 110. The module 100 may include a door 102 and a front face 104. The door 102 may be disposed on the front face 104. In other words, the front face 104 may include the door 102. The module 100 may include a tray 106 or a plurality of trays. The tray 106 may be extendable from a recessed position within the module 100. The tray 106 may be accessible through the door 102. In other words, a user may open, lift, or pull down the door 102 allowing access to the tray 106. In an example, the door 102 may include a handle or other means for ease of opening the door 102. In response to the opening of the door 102, a user may pull the tray 106 out of or partially out of the module 100. The tray 106 may include a slot 108 or interface to allow insertion of a memory module 110. The memory module 110 may include a plurality of slots 112 to accept memory devices. The module 100 may include an interface 114 or interfaces to connect the module 100 to a host. In other words, the interface 114 may connect the memory module 110 to an interface located at the back of the module. The interface located at the back of the module 100 may allow, via a port, cable, or an interface connected via a midplane, a host to connect to the memory module 110.

As used herein, a "computing device" may be a storage array, storage device, storage enclosure, server, desktop or laptop computer, computer cluster, node, partition, virtual machine, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory.

As used herein, "hot plug" may refer to the act of adding a component or components to a system while the system is powered on and/or running. Further, hot plug may include the continued operation of the system without significant interruption when the component or components are added. In other words, a device may be added to a system while the system is operating and the user or the system itself may perform an administrative task, so that the added device can be utilized. Hot plug may also be referred to with terms such as, hot pluggable, hot plugging, or hot pluggability. For example, a device may be noted to be "hot pluggable".

As used herein, "hot swap" may refer to the act of replacing, removing, or adding a component or components while the system is powered on and/or running. Further, hot swap may include the continued operation of the system without interruption. In other words, in response to a hot swap operation (for example, replacing one device with a new device), a system may operate as normal without interruption. Hot swap may also be referred to with terms such as, hot swappable, hot swapping, or hot swappability. In other words, a device may be noted to be "hot swappable".

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, a "blade enclosure" may refer to an enclosure or chassis which may accept various computing devices. For example, a blade enclosure may be a metal chassis with a midplane disposed in, approximately, the middle of the blade enclosure. The midplane may include various connections and traces. In such examples, the blade enclosure may accept computing systems (such as, blade servers or half-height blade servers), storage sub-chassis', and/or management modules in the front. The blade enclosure may accept power supplies, cooling devices (such as fans or liquid cooling interfaces), switches, interconnects, management modules, module 100, and/or other computing devices. A blade enclosure may be equivalent to 10 U. As used herein, a "blade server" may refer to a computing device of a different height, depth, and width than that of a standard rack server. The blade server, as described above, may rack or be inserted into the front of a blade enclosure. The blade server may offer the same functionality as a rack server, but in a smaller form factor.

As used herein, a "midplane" may refer to a printed circuit board (PCB) with connections disposed on the front of the PCB and the back of PCB. The midplane may include connections for computing devices and peripherals, such as power supplies, cooling devices, interconnects, switches, management modules, and/or other computing devices. The midplane may include cutouts or apertures to allow air to flow through a chassis or enclosure (for example, airflow through a blade enclosure). In an example, a blade enclosure may include a midplane. The midplane may be disposed in the middle of the blade enclosure. In an example, the front of the midplane may include connections for a plurality of blade servers. In a further example, the back of the midplane may include connections for other peripheral devices. The midplane may include routing or tracing/traces to connect the components connected via the front of the midplane to the components connected via the back of the midplane.

As described above, FIG. 1 is a block diagram of a module 100 including a memory module 110. As noted, the tray 106 may be extendable from a retracted or recessed position within the module 100. When the tray 106 is in the retracted or recessed position within the module 100, a gap may be formed between the front face 104 and the tray 106. The module 100 may include air channels with openings facing the rear of the module 100 and on both sides of the module 100. Air may flow into the air channels. As the air flows into the air channels, air may flow through the gap formed between the front face 104 and the tray 106. As air flows into the gap, the air may be forced through the tray 106. In other words, air may flow through the memory module 110 or memory modules, thus cooling the memory module 110 or memory modules. In such examples, the door 102 disposed on the front face 104 of the module 100 may create a seal. The seal created by the door may prevent air from leaking outside of the module 100. In other words, the seal may create a vacuum, forcing air through the tray 106 and memory modules 110. Additionally, the seal may also prevent EMI from entering or leaking from the module 100 (the EMI potentially affecting operation of the memory devices in the module 100 or operation of other components located near the module 100). In another example, the tray 106 may be disposed on one side of the module 100. In a further example, the other side of the module 100 may include nothing. In such examples, the module 100 may include a baffle to maintain the gap (the gap that may be formed between the front face 104 of the module 100 and the portion of the module 100 with the tray 106) where no components are located.

As described above, the memory module 110 may include a plurality of slots 112 or plurality of interfaces for memory devices. In an example, the memory module 110 may include a plurality of slots 112 for any type of machine-readable storage medium. In another example, the plurality of slots 112 or plurality of interfaces may be dual in-line memory (DIMM) slots or interfaces. In another example, the plurality of slots 112 or plurality of interfaces may be differential DIMM (DDIMM) slots or interfaces. In another example, the plurality of slots 112 or plurality of interfaces may be a slot or interface to accept any other type of volatile or non-volatile memory device. In another example, the memory devices may be dynamic random access memory (DRAM) devices, nonvolatile memory express (NVMe) devices, differential DRAM, Enterprise and Datacenter Solid State Drive Form Factor (EDSFF) 3 inch drives, storage class memory (SCM), and/or various other memory devices.

As described above, the tray 106 may be disposed on one side of the module 100. As described above, the other side of the module 100 may include nothing. In another example, the other side of the module 100 may include network ports or interconnect ports. In other words, the network port may be adjacent to the tray 106. In such examples, the network ports may connect any host connected to the module 100 (via interfaces located at the rear of the module 100) to a network. In another example, the interconnect ports may connect any host connected to the module 100 (via interfaces located at the rear of the module 100) to another computing device, enclosure, and/blade enclosure. In such examples, the network ports and/or interconnect ports may block one air channel located at the side of the module 100. While one air channel may be blocked, the other air channel may provide air flow for the memory module 110 or memory modules (via the tray 106). In another example, the interconnect port may connect to interface 114. In such examples, the interconnect port may connect other hosts, through the interface 114, to the memory module 110 to allow other hosts to share and/or access the memory module 110. In a further example, the interconnect port may port may connect other blade enclosures, through interface 114, to the memory module 110 to allow other blade servers in the other blade enclosures to share the memory module 110. In these examples, the module may function as a memory pool, a switch, and/or interconnect.

As described above, the module 100 may include a tray 106 with a slot 108 to accept a memory module 110. In such examples, the memory module 110 may be hot pluggable. In other words, a user may add the memory module 110 to the tray 106, while the module 100 is powered on and operating (as in, connected to a host and the host reading/writing to other memory modules within the module 100). In another example, the memory module 110 may be hot swappable. In other words, a user may add or remove the memory module 110 to or from the tray 106 while the module 100 is powered on and operating (as in, connected to a host).

Figure 2:
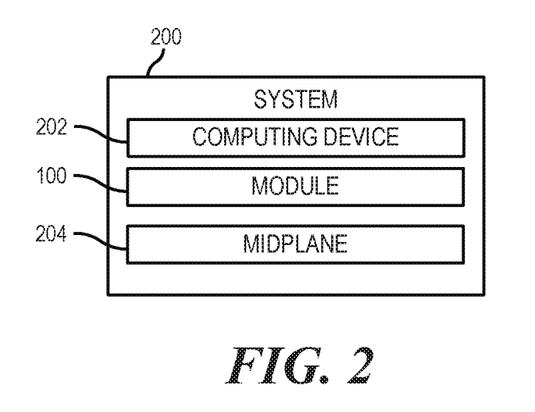
FIG. 2 is a block diagram of a system including the module, according to an example.

FIG. 2 is a block diagram of a system 200 including the module 100. In such examples, the system may include a computing device 202 and a midplane 204. The midplane 204 may connect the module 100 to the computing device 202. In an example, the module 100 and computing device 202 may connect to the midplane on the same side or on opposite sides. In another example, the system 200 may include a plurality of modules and/or a plurality of computing devices. In another example, the module 100 may be an interconnect module (which also includes memory modules) and/or a switch module (which also includes memory modules). In another example, the system 200 may be a blade enclosure, the computing device 202 may be a blade server, and the module 100 may be an interconnect module or switch module.

In another example, the system 200 may include a rack. The rack may include a computing device 202, such as a rack server. The rack may include the module 100. In such examples, system 200 may not include a midplane 204. Further, in such examples, the module 100 may be a switch, a switch smaller than 1 U, a top-of-rack switch, or a smaller than 1 U module. In such examples, the module 100 may connect to the computing device 202 via a cable connected to the interface located at the rear of the module 100.

Figure 3:
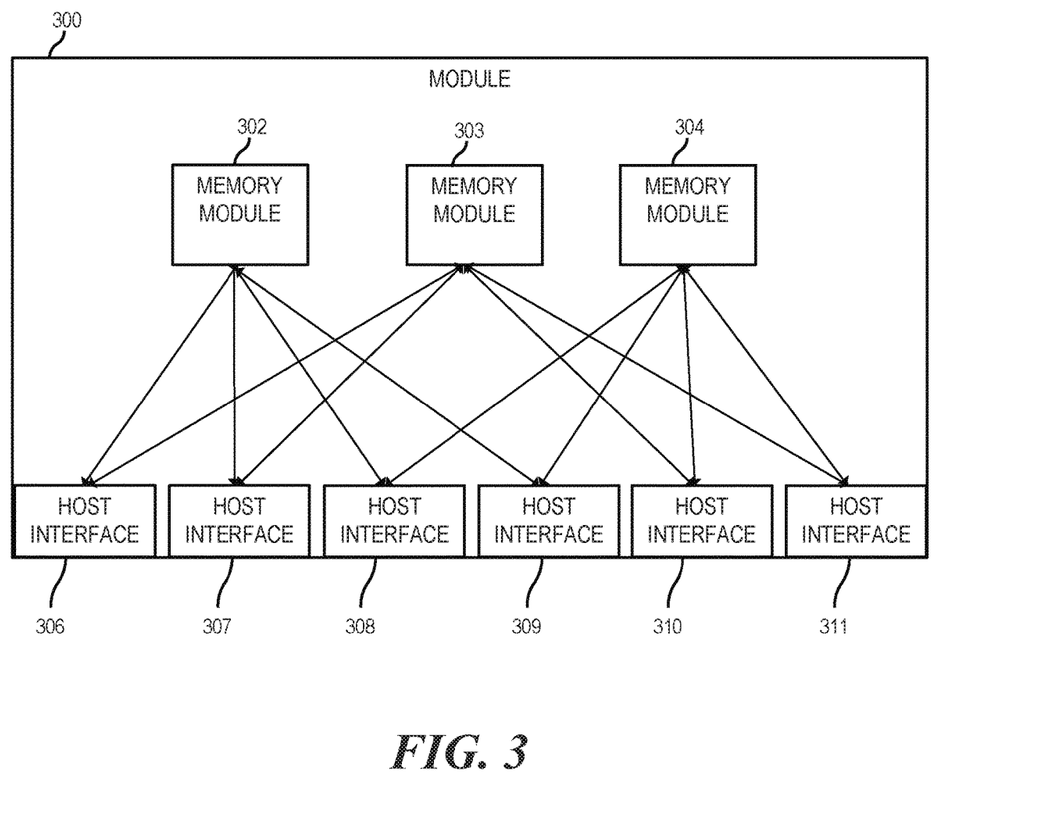
FIG. 3 is a block diagram of a module with a plurality of memory modules, according to an example.

FIG. 3 is a block diagram of a module 300 with a plurality of memory modules 302, 303, 304. A module 300 may include a plurality of memory modules 302, 303, 304. As described above, a memory module (for example, memory modules 302, 303, 304) may connect to a plurality of hosts. In such examples, the memory modules 302, 303, 304 may connect to the plurality of hosts via a host interface 306, 307, 308, 309, 310, 311. Further, various topologies (as in, which memory module connects to which host) may be implemented. In an example, each memory module 302, 303, 304 may connect to more than one host. Further, memory module 302, 303, 304 may connect to different hosts (in other words, the module 300 may support various topologies). For example, the tray may include three memory modules 302, 303, 304 to connect to six hosts. The module 300 may include six host interfaces 306, 307, 308, 309, 310, 311 located in the rear of the module to connect to the six hosts. In such examples, a first memory module 302 may connect to the first four hosts via the first four host interfaces 306, 307, 308, 309, the second memory module 303 may connect to the first two and last two hosts via the first two and last two host interfaces 306, 307, 310, 311, and the third memory module 304 may connect to the last four hosts via the last four host interfaces 308, 309, 310, 311. Various other topologies may be implemented in various other implementations of module 300. In such examples, a host may utilize the memory modules the host is connected to. In other examples, memory modules may connect to other hosts via a network connection disposed next to the tray. In such examples, the topologies may vary further, as different hosts may connect via the network connection and host interfaces.

Figure 4:
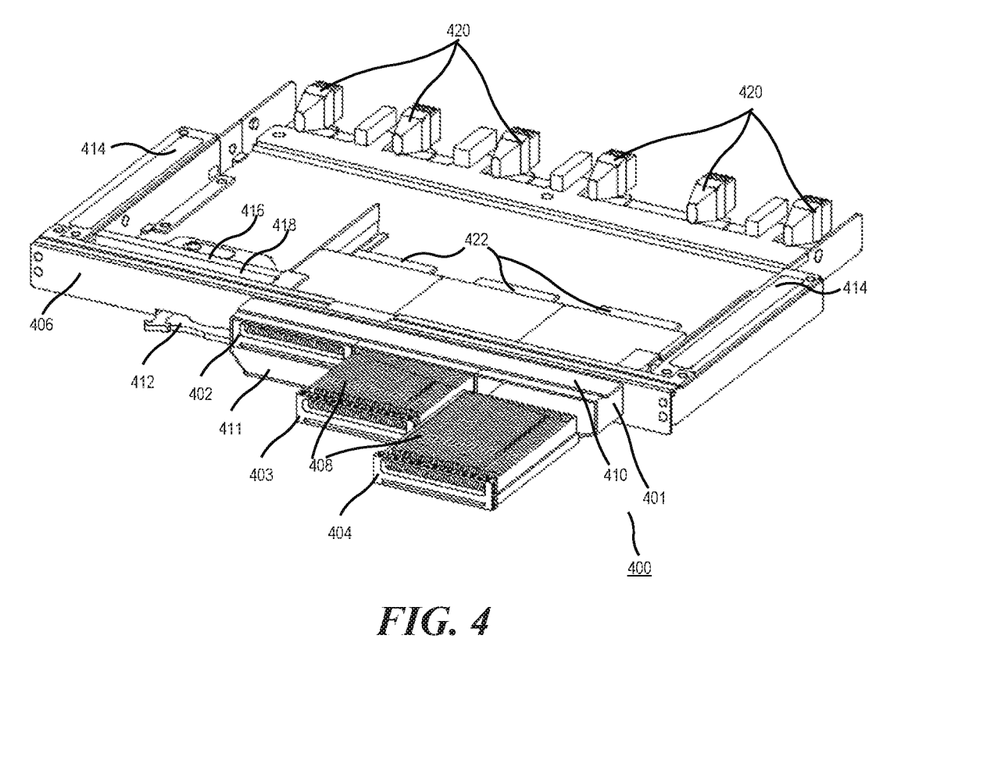
FIG. 4 is a schematic view of a module with memory modules at different positions, according to an example.

FIG. 4 is a schematic view of a module 400 with memory modules 402, 403, and 404 at different positions. The module 400 may include three memory modules 402, 403, 404. The tray 401 is shown in an extended position. In an example, the tray 401 may, when fully extended, protrude partially from the module 400. In another example, the tray 401 may be removable from the module 400. In an example, as the tray 401 is extended, the door, composed of an upper plate 410 and lower plate 411 (both connected to the front face 406 of the module 400), opens. In such examples, the lower plate 411 may open downwards and the upper plate 410 may open upwards. The tray 401, when fully extended, may allow for insertion of memory modules 402, 403, and 404. FIG. 4 illustrates a memory module 402 inserted into the tray 401, a memory module 403 partially inserted into the tray 401, and a memory module 404 external to the tray 401. As the memory module 402, 403, and 404 is inserted into the tray, the memory module 402, 403, and 404 may connect to an interface 422 (the internal connector portion of the interface 422 not shown) in the tray 401. In an example, the tray 401 may include rails (not show) to allow the tray 401 to slide into the extended and retracted or recessed position. The memory modules 402, 403, 404 may include a plurality of memory devices 408. The interface 422 may connect via cables (not shown) to the interfaces 420 located at the rear of the module 400.

In another example, the module 400 may include a baffle 416 to maintain the gap 418 formed between the tray 401 and front face 406, as well as the upper and lower plate 410, 411, when the tray 401 is in a retracted recessed position. In another example, the module 400 may include air channels 414 on one or both sides of the module 400. In such examples, air may flow in from the rear of the module 400. The air may then flow through the gap 418 and then through the memory modules 402, 403, and 404. In another example, the module 400 may include a handle 412 for removal from an enclosure or chassis (for example, a blade enclosure).

Figure 5:
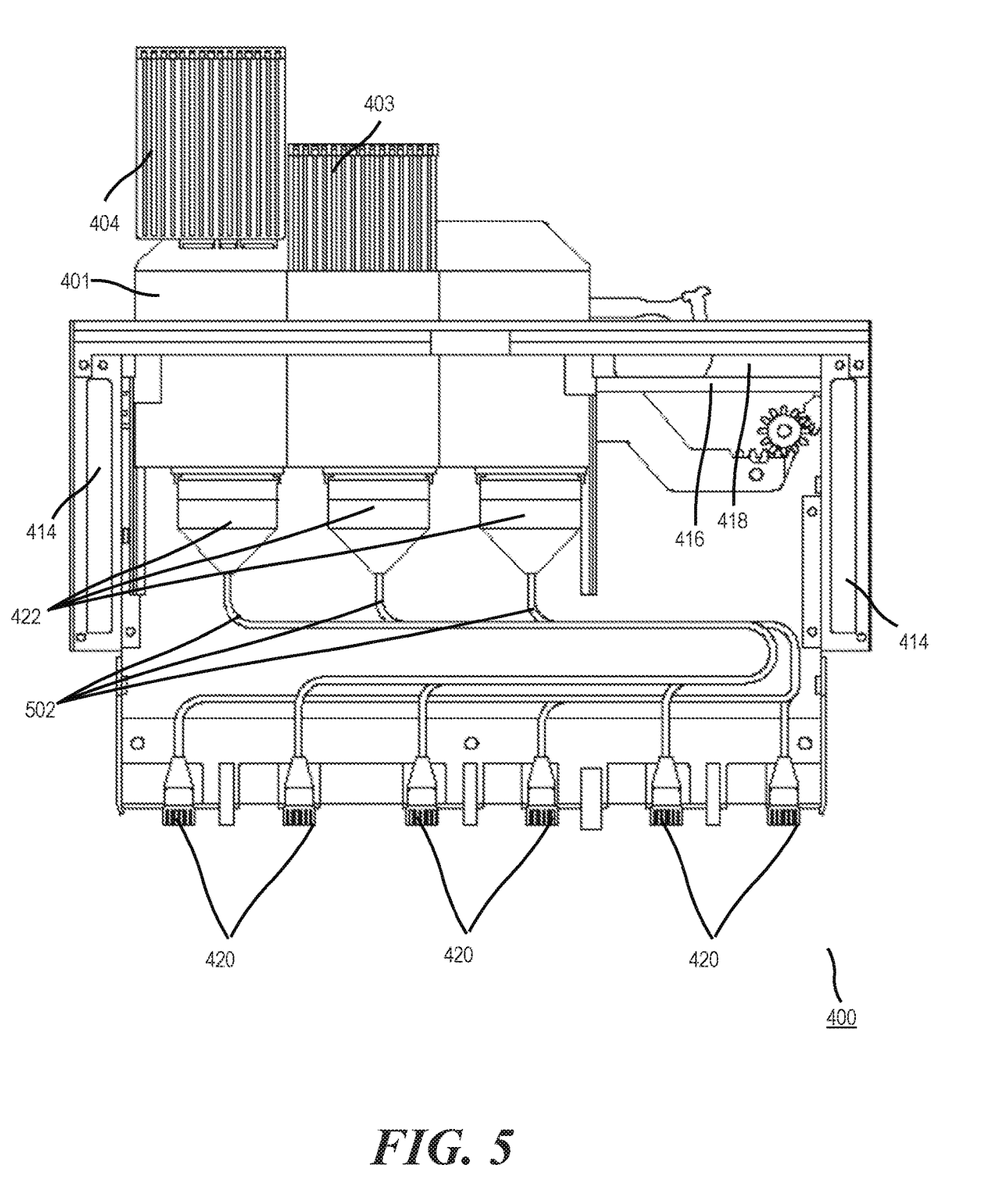
FIG. 5 is a schematic top-down view of the module with memory modules at different positions, according to an example.

FIG. 5 is a schematic top-down view of the module 400 with memory modules 404, 403 at different positions. As described above, the tray 401 may extend from the module 400. The memory modules 404, 403 (memory module 402 not shown, as memory module 402 is fully inserted into the tray 410) may be inserted into the tray 401 when the tray 401 is fully or partially extended from the module 400. FIG. 5 illustrates the cabling in module 400. In examples, cables 502 may connect the interface 422 to the interface 420 located at the rear of the module. As described above, various topologies may be implemented in module 400. In FIG. 5, the gap 418 formed between the tray 401 and the front face of the module is only partially shown. As the tray 401 is pushed back into the module 400, the gap 418 may extend across the module 400, allowing for air flow to pass through the tray 401. In another example, the module 400 may include a cable harness, cable management system, cable guides, or some other means to organize the cables 502 within the module 400.

Figure 6:
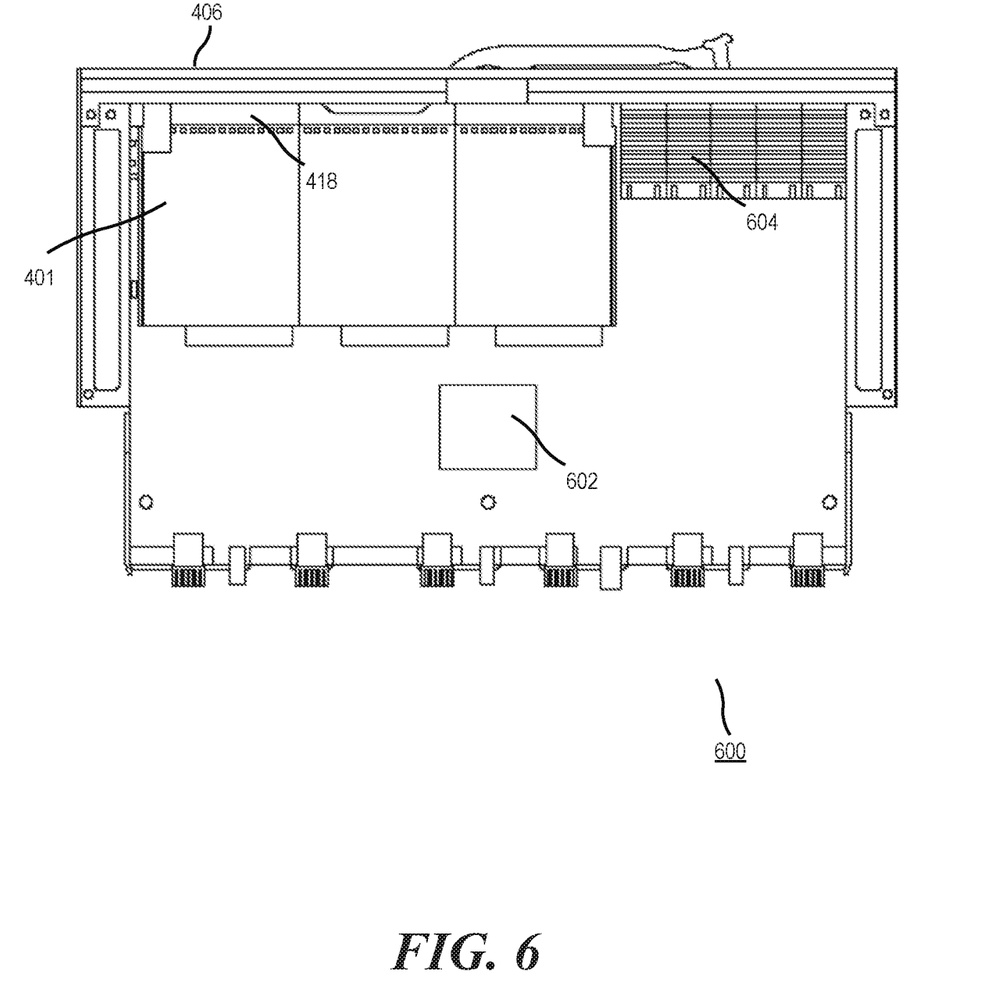
FIG. 6 is schematic top-down view of the module with an application specific integrated circuit disposed between the memory modules and interface located at the back of the module, according to an example.

FIG. 6 is schematic top-down view of the module 600 with a processing resource 602 disposed between the memory modules and interface located at the back of the module 600. As described above and illustrated in FIG. 6, when the tray 401 is in a recessed position, a gap 418 may be formed between the front face 406 and the tray 401. In another example, the module 600 may include a processing resource 602. In a further example, the processing resource may be an ASIC. In such examples, the memory modules may connect to the processing resource 602. The processing resource 602 may connect to the interfaces located at the rear of the module 600. In such examples, the processing resource 602 may function as a switch, memory controller, memory pool controller, coherency module/controller (to maintain coherency between each memory module and the memory devices contained in the memory modules), and/or management device. In other words, the processing resource 602 may control memory read and write operations, maintain coherency of the memory devices contained in the memory module, control access to the memory modules, and/or perform various other memory related tasks.

In another example and as described above, the module 600 may include a network port 604 or interconnect port. The module may include one or more network ports 604. In such examples, when a network port 604 is disposed in the module 600, the network port 604 may block air flow from one of the air channels. In such examples, air flow from the other air channel may cool the memory modules. In another example, the network port 604 may be a small form factor pluggable double density (SFP-DD) interface, a quad SFP-DD (QSFP-DD) interface, an octal small form factor (OSFP) interface, an Ethernet interface, a management interface, an interconnect interface, and/or any other interface utilized to transfer data between computing devices.

Figure 7:
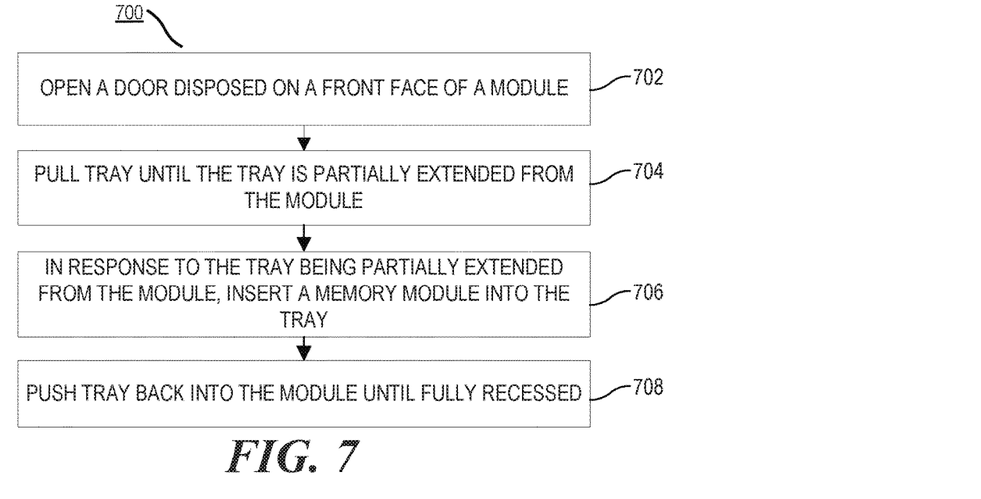
FIG. 7 is a flow chart of a method to add a memory module to a module, according to an example.

FIG. 7 is a flow chart of a method to add a memory module to a module. Although execution of method 700 is described below with reference to the module 100 of FIG. 1, other suitable systems or modules may be utilized, including, but not limited to, system 200, module 400, or module 600. Additionally, implementation of method 700 is not limited to such examples.

At block 702, a user may open the door 102 disposed on the front face 104 of a module 100. In an example, the door may include a handle. In another example, the door 102 may be connected to the front face 104 of the module 100 via hinges. In another example, the tray 106 may include a handle that protrudes through the door 102. Further, when a user pulls the handle, the door 102 may open upwards and/or downwards (upwards and downwards in the case that the door may be composed of more than 1 plate or piece). Further, as the tray 106 is extended from the module 100, the tray 106 may maintain the open position of the door 102. In such examples, the door 102 may automatically close as the tray 106 is re-inserted into the module 100. In another example, when a user opens the door 102, the door 102 may lock into an open state via a lock mechanism attached to the door 102. In further example, the door 102 may close when the door 102 is actuated by the user. In another example, the door 102 may open upwards or downwards. In another example, the door 102 may slide open via a channel disposed along the inside of the front face 104 of the module 100. In another example, the door 102 may be composed of more than one plate. For example, the door 102 may include an upper plate and a lower plate. The upper may open upwards and the lower plate may open downwards. In another example, the door 102 may be surrounded by a gasket. In a further example, the gasket may form a seal along the front face 104 of the module 100 when the door 102 is closed. Further, the gasket may prevent air leakage and EMI. In a further example, the gasket may be composed of rubber.

At block 704, a user may pull the tray 106 from a recessed position until the tray 106 is fully or partially extended from the module 100. In such examples, when the tray 106 is fully or partially extended from the module 100, a user may add or remove a memory module 110. The tray may include a slot 108, interface, or connection for memory module 110 to connect to. In another example, tray 106 may include rails or other means to slide into and out of the module 100.

At block 706, a user may insert the memory module 110 into the tray 106. The user may insert the memory module into the tray 106 until the memory module 110 is connected to the slot 108, interface, or connection. In an example, when the tray 106 is in a fully or partially extended position, the tray 106 may lock into place via a locking mechanism. The tray 106 may lock into place to allow proper insertion of the memory module 110.

At block 708, a user may push the tray 106 back into the module 100. In an example and as described above, the tray 106 may lock into place when partially or fully extended from the module 100. In such examples, the user may disengage or actuate the locking mechanism and push the tray 106 back into the module.

In another example and as described above, the memory module 110 may be hot pluggable. Therefore, a user may perform the steps described above while the system is power on or powered off. In another example, the user may remove the memory module 110 similar to how a memory module 110 is added to the module 100. In a further example, the memory module 110 may be removed while the module 100 is powered on.

Although the flow diagram of FIG. 7 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

Figure 8A:
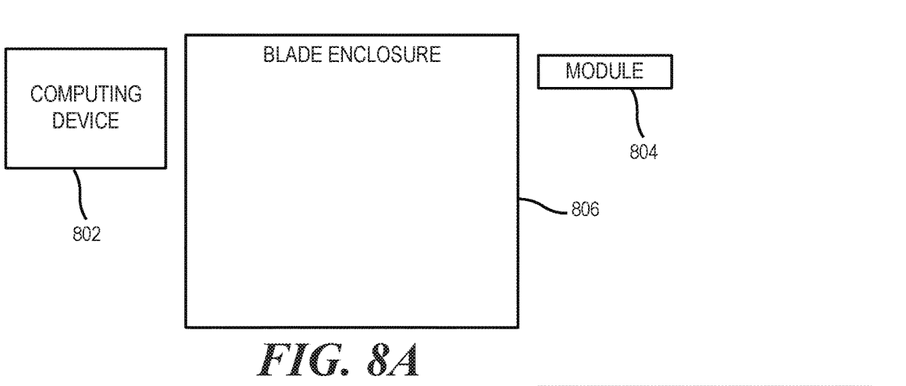
FIGS. 8A and 8B are block diagrams of a blade enclosure, computing device, and switch, according to an example.
Figure 8B:
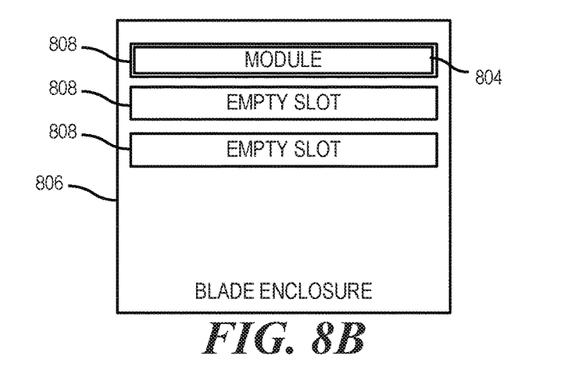

FIGS. 8A and 8B are block diagrams of a blade enclosure 806, computing device 802, and switch 804, according to an example. In such examples, a blade enclosure 806 may include slots on the back and front to accept computing devices 806 and switches or modules 804 (for example, slots 808 to accept a switch and/or module 804). In such examples, the switch or module 804 may be pushed into or added into the blade enclosure 806. For example, FIG. 8A illustrates a blade enclosure 806 with a computing device 802 and switch or module 804 external to the blade enclosure 806 (as in, ready to be added to the blade enclosure 806). In a further examples, the blade enclosure 806 may include a midplane (not shown). The midplane may include connectors to connect computing devices to the switches or modules. In another example, the module 804 may include network ports and the memory modules, thus offering network connections, as well as expanded memory capabilities. In other words, the module 804 may be the same as a switch (or have the same form factor).

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A module, comprising:
   a door disposed on a front face of the module;
   a tray, accessible through the door, the tray including a slot to accept a memory module,
   wherein the memory module includes a plurality of slots for memory devices,
   wherein the tray is extendable from a recessed position within the module to a position extended from the module, to allow insertion of the memory module in the tray,
   wherein the door creates a seal on the front of the module to prevent airflow leakage from the front face of the module; and
   an interface to connect the memory module to a host.

2. The module of claim 1, wherein a gap between the tray, in the recessed position, and the front face of the module allows air flow to be driven through memory module.

3. The module of claim 2, wherein the door prevents air and electromagnetic interference (EMI) leakage.

4. The module of claim 1, wherein the memory devices include storage class memory (SCM) and Differential Dual In-Line Memory Modules (DDIMMs).

5. The module of claim 1, wherein the memory devices are Enterprise and Datacenter Solid State Drive Form Factor (EDSFF) 3" Drives.

6. The module of claim 1, wherein the module includes a network interface to connect a host to external computing devices.

7. The module of claim 6, wherein the network interface is adjacent to the tray.

8. The module of claim 1, wherein the interface connects the module to a midplane, the midplane to connect the host to the memory module.

9. The module of claim 1, wherein the module fits in a switch slot of a blade enclosure.

10. The module of claim 1, wherein the memory module is hot pluggable.

11. A module, comprising:
    a front and a back,
    wherein the front includes a door to cover an opening;
    a tray disposed in the opening in a recessed position,
    wherein the tray extends from the recessed position within the module to a position partially extended from the module,
    wherein the tray includes connectors for memory modules, and
    wherein the memory modules include slots for a plurality memory devices;
    a plurality of cables, each cable to connect each memory module to an interface, wherein the interface is at the back of the module and the interface connects to a midplane; and
    a gap between an inside of the front of the module and the tray in the recessed position, to allow airflow to pass through the gap to the memory module.

12. The module of claim 11, wherein the module includes a network interface in the front and the network interface is connected to an interface at the back of the module.

13. The module of claim 11, wherein the tray includes rails to allow the tray to extend to the position partially extended from the module.

14. The module of claim 11, wherein the door creates a seal on the front of the module to prevent airflow and EMI leakage.

15. The module of claim 11, wherein the module includes two sides, each of the two sides including openings near the back of the module that allow air to flow in.

16. The module of claim 11, wherein the module includes a baffle to maintain the gap in a portion of the module that does not include the tray.

17. The module of claim 11, wherein the door includes a handle to allow the door to be opened in a downwards direction.

18. A system, comprising:
- an enclosure including a computing device and a switch, wherein the computing device is disposed in a front of the enclosure, the switch is disposed in a back of the enclosure, and a midplane connects the computing device to the switch,
- wherein the switch includes:
  - a door, to create a seal to prevent air leakage from the front of the switch;
  - a tray, accessible through the door;
  - a memory module, stored in the tray, wherein the memory module includes a plurality of slots for memory devices; and
  - a cable to connect the memory module to the computing device via the midplane.

19. The system of claim 18, wherein air flows into a gap between the door and tray to cool the memory module.

20. The system of claim 18, wherein the enclosure is a blade enclosure and the computing device is a blade server.

* * * * *